United States Patent
Matsumoto et al.

(10) Patent No.: US 6,682,967 B2
(45) Date of Patent: Jan. 27, 2004

(54) SEMICONDUCTOR DEVICE AND METHOD OF MAKING THE SAME

(75) Inventors: Masahiko Matsumoto, Yokohama (JP); Hirofumi Igarashi, Chigasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/127,507

(22) Filed: Apr. 23, 2002

(65) Prior Publication Data
US 2003/0006465 A1 Jan. 9, 2003

Related U.S. Application Data

(62) Division of application No. 09/819,619, filed on Mar. 29, 2001.

(30) Foreign Application Priority Data
Mar. 29, 2000 (JP) ........................................ 2000-090060

(51) Int. Cl.$^7$ .......................................... H01L 21/8238
(52) U.S. Cl. ...................................... 438/224; 438/942
(58) Field of Search ................................ 438/199, 218, 438/221, 223–224, 227–229, 232, 445, 448, 506, 671, 942–947; 257/371

(56) References Cited

U.S. PATENT DOCUMENTS

| | | | |
|---|---|---|---|
| 5,721,174 A | 2/1998 | Peidous | |
| 5,887,066 A | 3/1999 | Nakagawa | |
| 5,994,178 A | * 11/1999 | Wu | ............................ 438/221 |
| 6,020,621 A | 2/2000 | Wu | |
| 6,054,343 A | 4/2000 | Ashburn | |
| 6,130,469 A | 10/2000 | Bracchitta et al. | |
| 6,133,118 A | 10/2000 | Wu | |
| 6,133,150 A | 10/2000 | Nakajima et al. | |
| 6,162,699 A | * 12/2000 | Wang et al. | ................. 438/404 |
| 6,207,532 B1 | 3/2001 | Lin et al. | |
| 6,238,967 B1 | 5/2001 | Shiho et al. | |

FOREIGN PATENT DOCUMENTS

| | | |
|---|---|---|
| JP | 61-7034 | 3/1986 |
| JP | 6-21214 | 1/1994 |

\* cited by examiner

*Primary Examiner*—David Nelms
*Assistant Examiner*—David Vu
(74) *Attorney, Agent, or Firm*—Pillsbury Winthrop LLP

(57) ABSTRACT

A semiconductor device comprises a semiconductor substrate, a p-type well formed in the semiconductor substrate, an n-type well formed in the semiconductor substrate and positioned contiguous to the p-type well, an n-type diffused region formed in the p-type well, and a p-type diffused region formed in the n-type well, wherein a corner C1 having the p-type well on the inside is present in a part of the boundary pattern between the p-type well and the n-type well. At least one of the two sides defining the corner C1 extends from a top of the corner to the n-well by a predetermined width d over a predetermined length. The particular structure permits suppressing generation of a difference in a well isolation punch-through voltage between the corner and the straight portion of the well boundary of the semiconductor device, making it possible to provide a fine device structure while ensuring a desired well isolation punch-through voltage without relaxing a design rule.

7 Claims, 4 Drawing Sheets

SEMICONDUCTOR DEVICE AND METHOD OF MAKING THE SAME

CROSS REFERENCE TO RELATED APPLICATIONS

This application is a divisional of U.S. application Ser. No. 09/819,619, filed Mar. 29, 2001, the specification of which is incorporated by reference for all purposes.

CROSS-REFERENCE TO RELATED APPLICATIONS

This application is based upon and claims the benefit of priority from the prior Japanese Patent Application No. 2000-090060, filed Mar. 29, 2000, the entire contents of which are incorporated herein by reference.

BACKGROUND OF THE INVENTION

The present invention relates to a semiconductor device and a method of making the same, particularly, to a semiconductor device having a high punch-through voltage and a method of making the same.

With progress in a fine pattern of the design rule of a semiconductor device, a well isolation punch-through voltage has come to attract attentions depending on a boundary pattern between a p-well and an n-well in the case where the boundary pattern between the p-well and the n-well is present under an STI (shallow trench isolation) region formed selectively in a semiconductor substrate.

It is significant to compare, for example, the case shown in FIG. 7A, in which a boundary pattern 74 between a p-well 71 and an n-well 72 is straight, with the case shown in FIG. 7B, in which a boundary pattern 75 between the p-well 71 and the n-well 72 has right-angled corners.

Where the boundary pattern 74 between the wells is straight as shown in FIG. 7A, a distance L between diffused regions 73 and the boundary pattern 74 is given by, for example, 0.15 $\mu$m, which is required for obtaining a desired punch-through voltage therebetween. In this case, the diffused region 73 is formed in the p- and n-wells and represents a drain or source region of MOS FETs, a contact region, an active area, etc.

On the other hand, where the boundary pattern 75 between the wells 71 and 72 has a right-angled corner 76 as shown in FIG. 7B, a depletion layer 78 extends from the corner 76 toward a corner portion 77 of the diffused region 73 formed in the p-well 71 as denoted by an arrow (vector). The magnitude of the depletion layer 78 is given as a synthesized vector of depletion layers 791, 792 extending from the boundary pattern 75 in directions perpendicular to the boundary pattern 75, as denoted by arrows (vectors). Therefore, in order to ensure a desired punch-through voltage, required is, for example, 0.35 to 0.4 $\mu$m of the distance L between the diffusion region 73 formed in the p-well 71 and the well boundary 75. In other words, a remarkable difference is generated in the distance L as compared with the straight pattern. To be more specific, the distance L of 0.35 to 0.4 $\mu$m given above is 3 to 4 times as long as the distance L in the case where the boundary pattern 75 is straight.

In such a case, a design rule is set on the basis of the well isolation punch-through voltage in the corner of the boundary pattern of the well. In other words, the distance between the diffused region and the well boundary is set to 0.4 $\mu$m even in the case where the boundary pattern is straight. Alternatively, another moderated design rule is set for the corner of the boundary pattern of the well. However, the setting of such a design rule is disadvantageous in area and is obstructive to the fine device structure.

It should also be noted that, if the impurity concentration in the well is increased in an attempt to increase the well isolation punch-through voltage in the corner of the boundary pattern of the well, the junction capacitance of the well boundary is increased, which is disadvantageous in terms of the improvement of the operating speed of the element formed in the well.

On the other hand, the trench edge of the STI region requires a rounding control having a curvature in order to suppress the kink characteristic, as apparent from the cross sectional structure of the trench in the STI region shown in FIG. 8. The conventional process of forming a trench and the conventional rounding control process of the trench edge will now be described.

In the first step, a $SiO_2$ film 81 is formed on a p-type Si substrate 80, followed by forming a SiN film 82 on the $SiO_2$ film 81 and subsequently forming a $SiO_2$ film 83 on the SiN film 82. Then, the $SiO_2$ film 83, the SiN film 82 and the $SiO_2$ film 81 are selectively etched successively by a lithography technique and an anisotropic etching, e.g., RIE (reactive ion etching).

In the next step, the Si substrate 80 is etched in a depth of 0.5 $\mu$m by RIE, using the remaining $SiO_2$ film 83, the SiN film 82 and the $SiO_2$ 81 as a mask, thereby forming a trench 84 for the STI (shallow trench isolation) region.

After the RIE step for the trench formation, a $SiO_2$ film 87 is formed after removing a damaged layer on the substrate surface 86 within the trench 84 by Si dry etching caused by the RIE treatment, and carrying out a corner rounding oxidizing treatment for rounding the trench edge 85.

Then, an insulating film, e.g., a $SiO_2$ film (not shown), is buried in the trench 84 to provide an STI region. Thereafter, an $SiO_2$ film is deposited over the entire surface of the substrate, followed by planarizing the $SiO_2$ film by a chemical mechanical polishing (CMP) method. The $SiO_2$ film is further etched with $NH_4F$ or a dry etching until the SiN film 82 is exposed to the outside, thereby leaving the remaining $SiO_2$ film buried in the trench 84. Further, after the SiN film 82 is removed by etching, a heat treatment is applied for lowering the film stress of the buried $SiO_2$ film. Then, the ordinary processes of the well-channel forming steps is carried out.

In the conventional method described above, however, the isolation width of the finished element is increased, leading to a large difference between the design size defined by the mask size and the size after the processing. In order to obtain a desired design size, the difference in the processing size must be absorbed.

Under the circumstances, in the prior art, since the width of the source or drain region is exposed in the patterning step set smaller in so as to be smaller than the design size in anticipation of the amount of the difference in the processing size, the exposure margin for the fine isolation is reduced.

As described above, if the design rule is set in a manner to ensure a desired well isolation punch-through voltage in the case where the boundary pattern of the wells has the corner as shown in the conventional semiconductor device, the design rule thus set is obstructive to the fine device structure. Also, if the impurity concentration in the well is increased in an attempt to increase the well isolation punch-through voltage in the corner of the boundary pattern, the junction capacitance of the well boundary is increased, which is disadvantageous for the high speed operation of the element formed in the well.

Further, in the conventional processing method in which a corner rounding oxidation is performed for the rounding control of the trench edge of an STI region, the finished isolation width is increased, leading to a large difference between the design size defined by a mask size and the finished size.

BRIEF SUMMARY OF THE INVENTION

An object of the present invention is to provide a semiconductor device having a desired well isolation punch-through voltage and adapted for a fine device structure.

Another object of the present invention is to provide a semiconductor device that permits suppressing the increase in the junction capacitance in the well boundary to allow the semiconductor device to be operated at a high speed.

Another object of the present invention is to provide a method of making a semiconductor device having the fine device structure while ensuring a desired well isolation punch-through voltage without reluxing the design rule.

According to one aspect of the present invention, there is provided a semiconductor device which comprises a semiconductor substrate; a first well, provided in the semiconductor substrate, having a first conductivity type; a second well adjacent to the first well, provided in the semiconductor substrate, having a second conductivity type opposite to the first conductivity type; wherein a part of a boundary between the first well and the second well has a first corner, defined by two sides, containing the first well therein, and wherein at least one of the two sides includes an extended portion extended to the second well over a predetermined length from a top of the first corner by a predetermined width.

According to another aspect of the present invention, there is provided a method of making a semiconductor device which comprises the steps of preparing a semiconductor substrate; forming a first resist pattern on the semiconductor substrate, the resist pattern having a boundary pattern including a corner, the corner having an extended portion, extending from an internal angle side to an external angle side by a predetermined width over a predetermined length from a top of the corner, at least one of two sides having a predetermined angle; selectively introducing a first impurity, having a first conductivity type, into the semiconductor substrate to provide a first well therein; forming a second resist pattern on the semiconductor substrate so as to cover the first well; selectively introducing a second impurity, having a second conductivity type opposite to the first conductivity type, into the semiconductor substrate to provide a second well; forming a first diffused region within the first well; and forming a second diffused region within the second well.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.

Figure 1A:
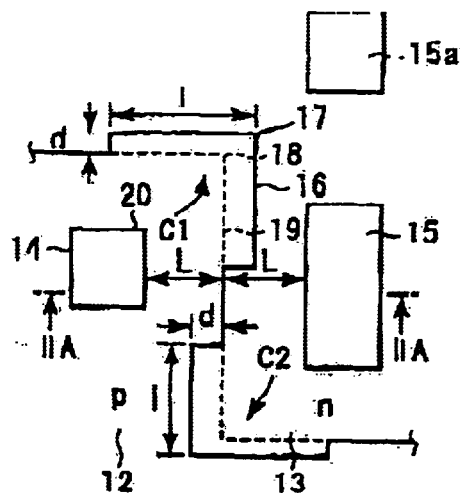
FIG. 1A is a plan view showing a part of a well boundary pattern of a semiconductor device according to a first embodiment of the present invention.
Figure 2A:
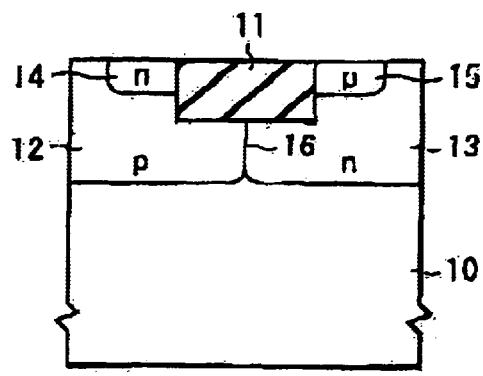
FIG. 2A is a cross sectional view showing a part of the well boundary along the line IIA—IIA in FIG. 1A.

FIG. 1A shows a part of a plane pattern of a semiconductor device according to a first embodiment of the present invention. FIG. 2A is a cross sectional view showing a part of the well boundary of the wells along the line IIA—IIA in FIG. 1A.

In the semiconductor device shown in FIGS. 1A and 2A an isolation region (an STI region 11 or a LOCOS region) of an insulating material is selectively formed in a semiconductor substrate 10, and a p-well 12 of a first conductivity type and an n-well 13 of a second conductivity type are provided under the STI region 11. An n-type first diffused region 14 is provided in the p-well 12 as a diffused region such as a drain or source region of a MOS FET, a contact region, an active area, etc. Also, p-type second diffused regions 15, 15a are formed in the n-well 13.

Figure 1B:
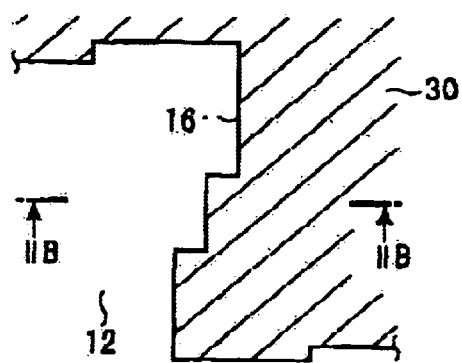
FIG. 1B is a plan view showing a first resist pattern having the well boundary pattern in FIG. 1A.
Figure 1C:
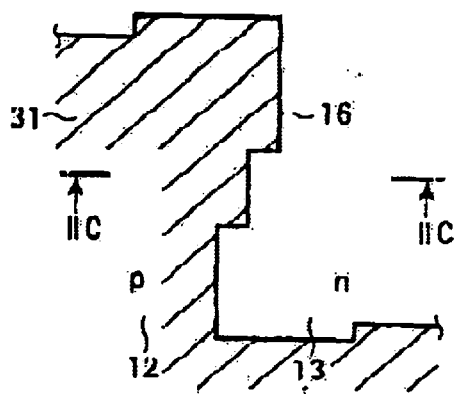
FIG. 1C is a plan view showing a second resist pattern having the well boundary pattern in FIG. 1A.
Figure 2B:
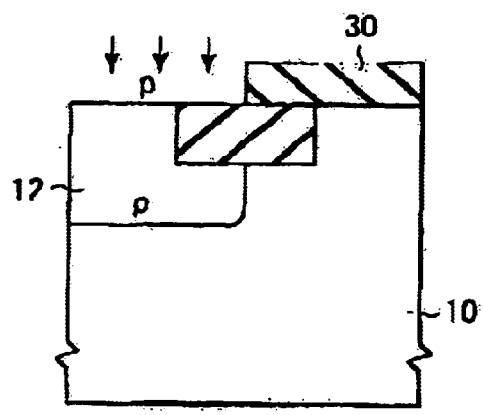
FIG. 2B is a cross sectional view showing a part of the well boundary along the line IIB—IIB in FIG. 1B.
Figure 2C:
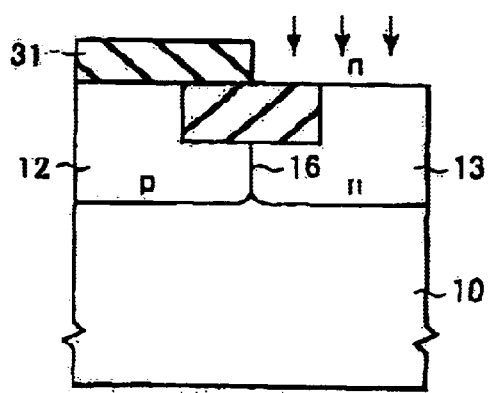
FIG. 2C is a cross sectional view showing a part of the well boundary along the line IIC—IIC in FIG. 1C.

Therefore a well boundary pattern 16, which is later described, is provided between the p-well 12 and the n-well 13 under the STI region 11. For producing the well boundary pattern 16, a first resist pattern 30 corresponding to the boundary pattern 16 is formed on the substrate surface as shown in FIG. 1B. Then, p-type impurity is introduced into the substrate 10, using the resist pattern 30 as a mask, thereby providing the p-well 12 therein as shown in FIG. 2B. After the first resist pattern 30 is removed from the substrate surface, the second resist pattern 31 corresponding to the boundary pattern 16 is formed on the substrate surface to cover the p-well 12 as shown in FIG. 1C. N-type impurity is introduced into the substrate 10, using the second resist pattern 31 as a mask, thereby providing the n-well 13 therein as shown in FIG. 2C.

A first corner C1 having the p-well 12 on the inside is present in a part of a boundary pattern 16 between the p-well 12 and the n-well 13. In the boundary pattern 16 having the first corner C1, at least one of the two sides defining a top 17 of the corner extends from the p-well 12 to the n-well 13 by a predetermined width d over a predetermined length l.

In this embodiment, a second corner C2 having the n-well 13 on the inside is also present in a part of the well boundary pattern 16. Similarly, in the boundary pattern having the second corner C2, at least one of the two sides defining a top of the corner extends from the n-well 13 to the p-well 12 by the predetermined width d over the predetermined length l.

The first corner C1 and the second corner C2 of the well boundary pattern 16 are positioned just under the STI region 11. Each of these corners is, for example, at right angle, and the both sides defining the corner are formed to have an extended pattern.

The width d of the extended pattern portion, i.e., the distance from the well boundary in the case where the well boundary is not extended, is set to ⅛ or more of the distance between the well boundary and the diffused region in the case where the well boundary is not extended.

In the case where the well isolation design rule DR is 0.8 µm, the width d is set to:

$$d \geq DR/8 = 0.1 \ \mu m \quad (1)$$

Also, the length l of the extended pattern portion, i.e., the length of the portion parallel to the well region boundary in the case where the well boundary is not extended, is set to ½ or more of the distance between the well region boundary and the diffused region in the case where the well boundary is not extended.

In the case where the well isolation design rule DR is 0.8 µm, the length l is set to:

$$l \geq DR/2 = 0.4 \ \mu m$$

In this example, the length l is set to 0.4 µm+d=0.5 µm.

Figure 7A:
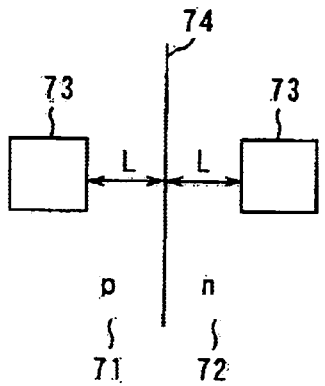
FIGS. 7A and 7B are plan views showing the difference in the well isolation punch-through voltage dependent on the boundary pattern of the well included in a semiconductor device, covering the cases where the boundary patter of the well has a right-angled corner (FIG. 7B) and is straight (FIG. 7A)
Figure 7B:
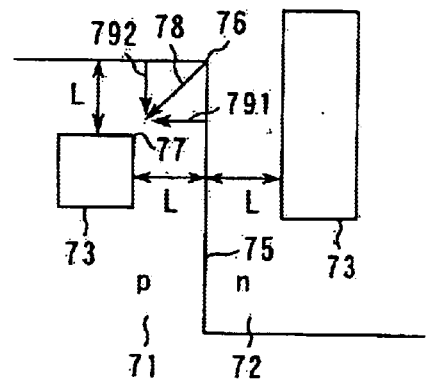
Figure 8:
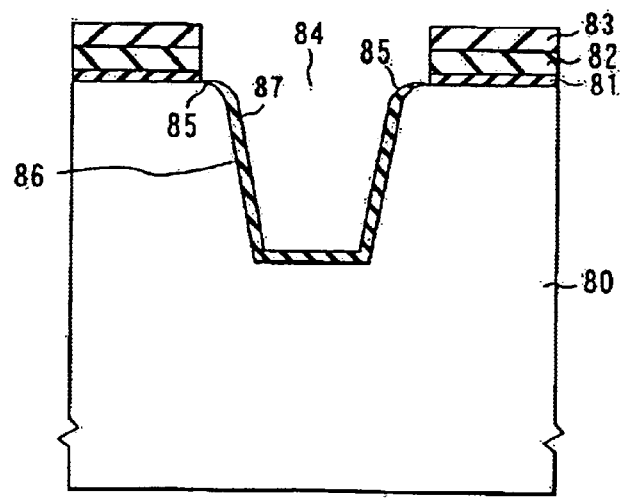
FIG. 8 is a cross sectional view showing a conventional rounding control for imparting a curvature to the trench edge of an STI region of a semiconductor device.

As described above, with regard to, for example, the first corner C1, the boundary pattern 16 extends from the p-well 12 to the n-well 13 by the width d over the length l from a dotted line 19 having a corner 18 (similar to the conventional boundary pattern shown in FIG. 7B). Therefore, when a voltage is applied to the diffused region 14, the depletion layer (not shown) extends from the corner 17 toward a corner portion 20 of the n-type diffused region 14 formed within the p-well 12, as in the prior art shown in FIG. 7B. By extending the portion having the length l and the width d, the distance for extending the depletion layer is increased in correspondence to the distance between the corners 17 and 18. In other words, the punch-through voltage is increased.

Figure 3:
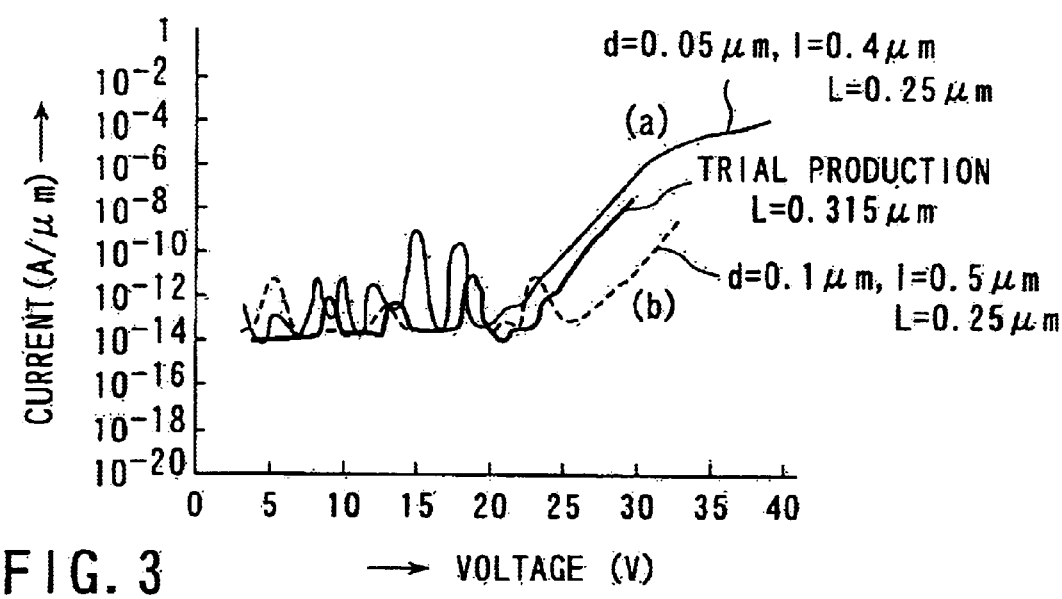
FIG. 3 is a graph showing experimental data on a punch-through voltage and a voltage (V)-current (I) characteristic of a trial production shown in FIG. 1 and the results of simulation.

FIG. 3 is a graph showing the experimental data on the punch-through voltage and the voltage (V)-current (I) characteristic of a trial production, in which the structure described above is employed in the well boundary, together with the result of simulation of the structure described above, with the experimental data being used as reference.

In this case, in order to ensure a desired well isolation punch-through voltage in the device, impurity ions are implanted into the semiconductor substrate having the STI region 11. Where the p-well is formed by implanting B ions at an energy of 260 keV at a dose of $1.60 \times 10^{13}/cm^2$, and the n-well is formed by implanting P ions at an energy of 320 keV at a dose of $1.20 \times 10^{13}/cm^2$, the required distance L between the diffused region and the well boundary is 0.315 µm.

On the other hand, the simulation is carried out assuming a generation product having both, for example, 0.18 µm of the distance L between the diffused region and the well boundary and 0.4 µm of the length l as a design rule. However, the distance L between the diffusion region and the well boundary differs from that of the trial production and, the value to be satisfied is used in view of the variation in the design size and the alignment error.

In this case, the distance L between the diffused region and the well boundary required for ensuring a desired well isolation punch-through voltage is 0.25 µm a under condition (a) having d=0.05 µm and l=0.4 µm. On the other hand, the distance L between the diffused region and the well boundary required for obtaining the V-I characteristic equal to that under the condition (a) is 0.25 µm under a condition (b) having d=0.1 µm and l=0.5 µm. Further, the P ion implantation condition to the bottom of the STI region 11 is changed to the dose of $6.00 \times 10^{12}/cm^2$ for forming the n-well. for As apparent from the results shown in FIG. 3, if the width d and the length l of the extended portion of the corner are set to the formulas (1) and (2), it can be to obtain a desired well isolation punch-through voltage even if the distance between the diffused region and the well boundary has 0.25 µm.

To be more specific, according to the semiconductor device having the structure shown in FIGS. 1 and 2, the depletion layer is extended inside the corner of the well boundary to suppress a voltage difference in the well isolation punch-through voltage between the corner and the straight portion of the well boundary. Therefore, it can be possible to obtain the fine device structure without relaxing the design rule while ensuring a desired well isolation punch-through voltage. For improving the well isolation punch-through voltage, it is unnecessary to set the impurity concentration in the well to a level higher than that in the case where the well boundary is straight. As a result, the junction capacitance of the well boundary is not increased, which is advantageous for operating the semiconductor device at a high speed.

Further, where a diffused region 15a is present within the n-well 13 in the vicinity of and outside the first corner C1, as shown in FIG. 1, or where a diffused region (not shown) is present within the p-well 12 in the vicinity of and outside the second corner C2, it is necessary to restrict the upper limit of the width d of the extended portion in order to maintain the distance between these diffused regions and the extended portion of the corner at a value not smaller than a predetermined value. A desired well isolation punch-through voltage for the straight portion of the well boundary 16 can be obtained by about ⅓ of the distance between the well boundary and the diffused region, as compared with the corner. Accordingly, it is desirable to set the upper limit of the width d of the extended portion of the corner to ½ or less of the distance between the well boundary 16 and the diffused regions 14, 15 in the case where the well boundary 16 is not extended.

Figure 4:
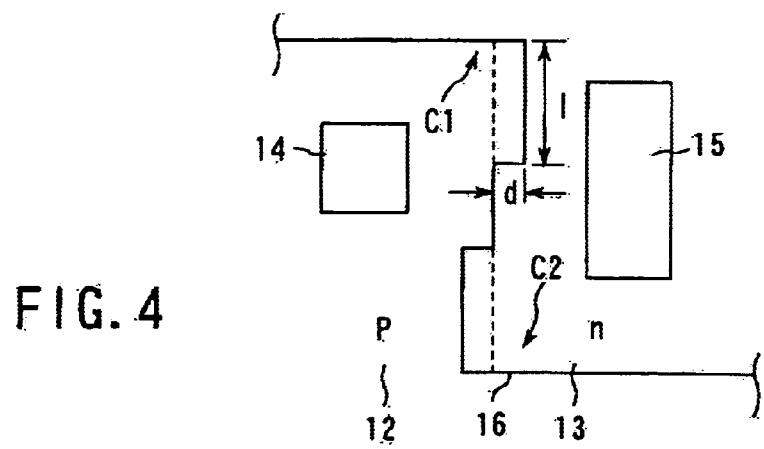
FIG. 4 is a plan view showing an extended portion extending to only one side of a right angled corner in the corner of the boundary pattern between a p-well and an n-well as a modification of the plane pattern of FIG. 1.

FIG. 4 is directed to a modification of the plane pattern shown in FIG. 1 and shows the case where the boundary pattern 16 is extended in only one side of the right-angled corner thereof between the p-well 12 and the n-well 13.

The present invention is not limited to the case where the corner of the boundary pattern is right-angled, and is also applicable to the case where the corner of the boundary pattern has an optional angle. In this case, it is possible to form a diffused region in the vicinity of the corner while ensuring a desired well isolation punch-through voltage without relaxing the design rule by providing a boundary pattern extending from the inside to the outside.

In the manufacturing process of the semiconductor device shown in FIGS. 1 and 2, an isolation region (the STI region 11 or a LOCOS region) is selectively formed in the semiconductor substrate 10. Thereafter, a first resist pattern (not shown) corresponding to the boundary pattern of the wells described above is formed on the substrate surface to mask an n-well to be provided. A p-type impurity is then introduced into the substrate by ion implantation to provide the p-well 12 therein.

Thereafter, a second resist pattern (not shown) corresponding to the boundary pattern of the wells referred to above is formed on the substrate surface to mask the p-well 12, followed by introducing an n-type impurity into the substrate by ion implantation to provide the n-well 13 therein.

Then, an n-type first diffused region (active region) 14 is selectively formed in the p-well 12, and a p-type second diffused region 15, for example, is provided in the n-well 13. In this case, the distance between the diffused region 14 and the boundary pattern 16 is set to 0.25 $\mu$m inside the p-well 12 in the vicinity of the right-angled corner of the boundary pattern 16, and the distance between the diffused region 15 and the boundary pattern 16 is set to 0.25 $\mu$m at the side of the n-well 13 outside the corner.

If the conventional corner rounding oxidation treatment is applied for rounding the trench edge of the STI region 11 in the manufacturing process of the semiconductor device according to the first embodiment of the present invention, a problem similar to that generated in the prior art is also caused.

Under the circumstances, the manufacturing process according to a second embodiment of the present invention, which permits suppressing the enlargement of the finished isolation width and also permits reducing the difference between the design size defined by the mask size and the finished size, will now be described with reference to FIGS. 5A, 5B and 6.

Figure 5A:
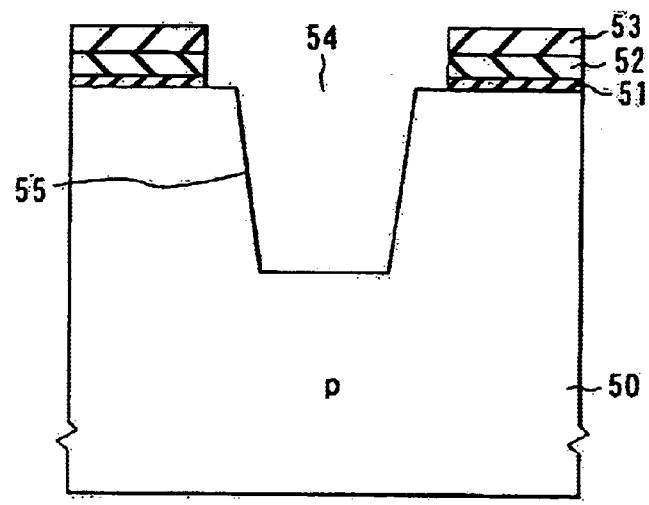
FIGS. 5A and 5B are cross sectional views collectively showing a manufacturing process of a semiconductor device according to the embodiment of the present invention.

In the first step, an $SiO_2$ film 51 is formed on, for example, a p-type Si substrate 50, followed by forming a SiN film 52 on the $SiO_2$ film 51 and subsequently forming a $SiO_2$ film 53 on the SiN film 52, as shown in FIG. 5A. Thereafter, using lithography and anisotropic dry etching techniques, the $SiO_2$ film 53, the SiN film 52 and the $SiO_2$ film 51 are successively removed to provide a mask.

Using the mask, the Si substrate 50 is etched by RIE to form a trench 54 for the isolation region therein.

In the next step, the mask (the $SiO_2$ film 53, the SiN film 52 and the $SiO_2$ film 51) is slightly removed by wet etching so that it recedes from the trench edge to expose a part of the substrate surface. Thereafter, in order to remove the damaged layer, which is derived from the RIE treatment, of the substrate surface 55 within the trench 54, the substrate surface 55 within the trench 54 is oxidized to form an oxide film (not shown), followed by removing the surface oxide film by wet etching.

Figure 5B:
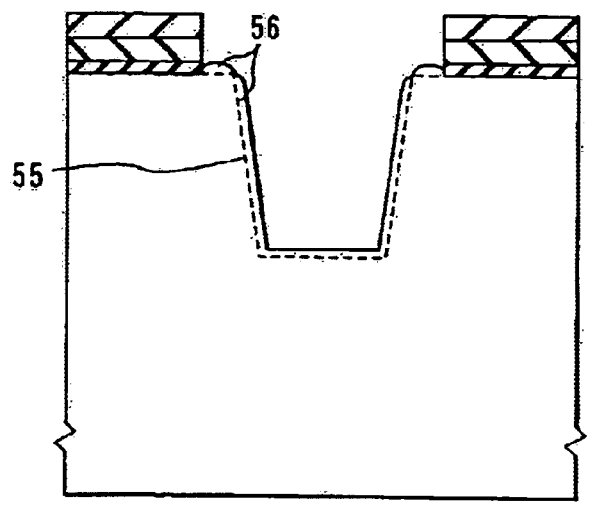
Figure 6:
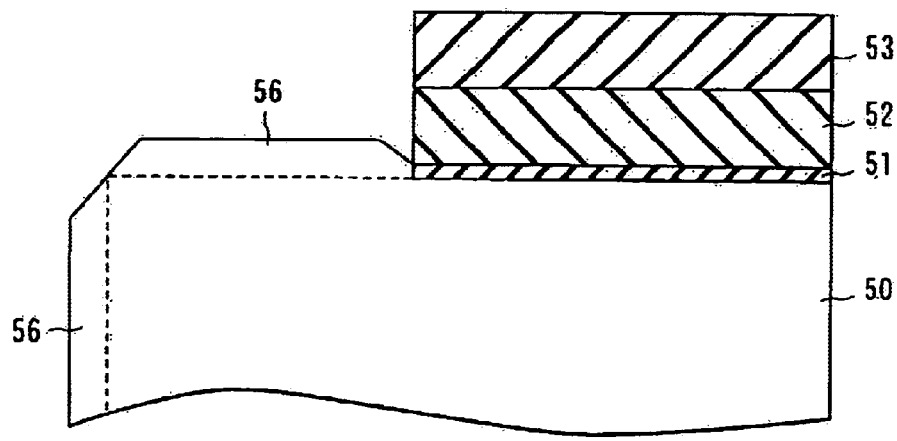
FIG. 6 is an enlarged cross sectional view showing a part of FIG. 5B.

In the next step, a Si epitaxial layer 56 is deposited by an epitaxial growth method on the substrate surface 55 within the trench 54, as shown in FIG. 5B and FIG. 6. In performing the epitaxial growth, the thickness of the epitaxial layer 56 is given by several tens nm in anticipation of the difference in the processing size between the mask size (design size) and the finished size. The Si crystal plane appears on the trench edge during the epitaxial growth.

After formation of the Si epitaxial layer 56, an insulating film, e.g., an $SiO_2$ film (not shown), is buried in the trench 54 to provide an STI region (not shown). After the deposition of the $SiO_2$ film, it is planarized by a CMP method. The $SiO_2$ film is etched with $NH_4F$ or by dry etching until the surface of the SiN film 52 is exposed, thereby remaining the buried $SiO_2$ film within the trench 54. After the SiN film 52 is removed by etching, a heat treatment is carried out to reduce the film stress of the buried $SiO_2$ film.

The ordinary processes of forming a well and a channel region are then carried out, followed by forming a gate insulating film, a gate electrode, and source-drain regions of a MOSFET. After forming an interlevel insulating film, making contact holes in the interlevel insulating film, and burying a contact plug of, for example, tungsten (W) in the contact holes, an AlCu wiring layers, for example, are provided. Further, it may be possible to apply an LDD structure to the source-drain regions and to form a metal silicide layer on the surfaces of the source-drain regions and the gate electrode.

According to the manufacturing method of the present invention, since the epitaxial growth is applied to the substrate surface within the trench 54 after the RIE treatment, the Si crystal plane appears in the trench edge, whereby the trench edge portion is rounded. Therefore, the angle of the trench edge is relaxed, as compared with the conventional corner rounding oxidizing treatment, making it possible to control the kink characteristic causing deterioration in the characteristics of the MOSFET.

In addition, since the epitaxial layer is deposited by a thickness corresponding to the difference in the processing size between the mask size and the finished size, the difference in the processing size can be reduced, as compared with the conventional rounding control by the corner rounding oxidizing treatment. Therefore, it can be possible to realize easily a design size adapted to a fine device structure while ensuring an exposure margin to provide the source-drain regions of the MOSFET as designed. As a result, it can be possible to maintain accurately the distance between the source-drain regions and the well boundary and, thus, to maintain a desired well isolation punch-through voltage.

Further, although the manufacturing processes include the epitaxial growth process, as compared with the conventional rounding control method, the total number of the processing steps are not increased and decreased because the corner founding oxidizing treatment is not reguired.

As described above, according to the present invention, a semiconductor device can be provided, which permits suppressing generation of a difference in a well isolation punch-through voltage between a corner and a straight portion of a well boundary, and providing a fine device structure without relaxing a design rule while ensuring a desired well isolation punch-through voltage.

Also, according to the present invention, there is provided a method of making a semiconductor device, which permits reducing a difference in a processing size between a design size and a finished size when carrying out a rounding control of a trench edge of an STI region, and setting accurately a distance between diffused regions to set accurately a distance between the diffused region and the well boundary.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of making a semiconductor device comprising:

forming a first resist pattern on a semiconductor substrate, said resist pattern corresponding to a well boundary pattern in a horizontal plane and including a corner defined by two sides at least one of said two sides including an extended boundary pattern defining a well portion of a first well, said well portion extending into a second well by a first distance from said corner and extending along said one of said two sides for a second distance longer than said first distance;

selectively introducing a first impurity, having a first conductivity type, into said semiconductor substrate by using said first resist pattern as a first mask to provide said first well therein;

forming a second resist pattern corresponding to a well boundary pattern on said semiconductor substrate so as to cover said first well therewith;

selectively introducing a second impurity, having a second conductivity type into said semiconductor substrate by using said second resist pattern as a second mask to provide said second well;

forming a first diffused region within said first well; and forming a second diffused region within said second well.

2. The method according to claim 1, wherein an angle of said corner is substantially at right angle.

3. The method according to claim 1, further including:

forming an isolation region in said semiconductor substrate before said first well is produced, wherein said well boundary pattern positioned under said isolation region.

4. The method according to claim 3, wherein said isolation region is produced by:

selectively etching said semiconductor substrate through a mask, using reactive ion etching, to provide a trench therein;

removing said mask from an edge of said trench by a predetermined width to expose a substrate surface including said edge;

depositing an Si epitaxial layer over said substrate surface; and burying an insulator in said trench.

5. The method according to claim 4, wherein a film thickness of said Si epitaxial layer is set in anticipation of a size difference between a mask size of said trench and a completed size of said isolation region.

6. The method according to claim 3, further including:

removing a damage layer, caused by said reactive ion etching, from the substrate surface within said trench, wherein the removal of said damage layer is carried out by:

oxidizing said substrate surface to form an oxide film thereon; and removing said oxide film from said substrate surface by wet etching.

7. The method according to claim 1, wherein only one of said two sides is extended to said second well to form said extended boundary pattern.

* * * * *